(12) United States Patent  
Gordon

(10) Patent No.: US 6,262,427 B1  
(45) Date of Patent: Jul. 17, 2001

(54) VARIABLE TRANSMISSION RETICLE FOR CHARGED PARTICLE BEAM LITHOGRAPHY TOOL

(75) Inventor: Michael S. Gordon, Lincolndale, NY (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/353,793

(22) Filed: Jul. 15, 1999

(51) Int. Cl.[7] .................................................. H01J 37/304

(52) U.S. Cl. ........................................................ 250/492.22

(58) Field of Search ......................... 250/492.22, 492.23, 250/505.1

(56) References Cited

U.S. PATENT DOCUMENTS 6,121,625 * 9/2000 Ito et al. ........................ 250/492.22

* cited by examiner

Primary Examiner—Kiet T. Nguyen  
(74) Attorney, Agent, or Firm—McGuireWoods, LLP

(57) ABSTRACT

A compound reticle having generally complementary clear and opaque areas on a portion of subfield in each of two reticle layers which can be moved relative to each other form a variable transmissivity shutter to regulate charged particle beam intensity independently of source beam current. Either homogeneous or inhomogeneous (e.g. having local variations in beam current density) can be produced at will and in rapid succession to study effects of beam current on beam pattern resolution and aberrations as well as optimum focus for particular patterned subfields having respectively differing transmissivities.

15 Claims, 3 Drawing Sheets

VARIABLE TRANSMISSION RETICLE FOR CHARGED PARTICLE BEAM LITHOGRAPHY TOOL

DESCRIPTION

BACKGROUND OF THE INVENTION

1. Field of the Invention

The present invention generally relates to charged particle beam systems and, more particularly, to control of beam current in electron beam projection lithography tools.

2. Description of the Prior Art

Lithographic processes are utilized in the manufacture of many diverse types of devices, particularly when very small areas must be selectively defined and/or operated upon, as in semiconductor integrated circuit manufacture. At least one lithographic process is invariably required for initial definition of locations and basic dimensions of devices such as transistors and capacitors in integrated circuits.

Lithographic processes currently used for integrated circuit manufacture involve the selective exposure of areas of a resist coated on a surface. In general, depending on whether the resist is of a positive or negative type, subsequent development will selectively remove either the exposed or unexposed areas leaving other areas substantially unaffected. In the past, radiant energy has been the resist exposure medium of choice.

However, modern integrated circuit designs require feature sizes smaller than can be resolved using even very short wavelengths of light in the deep ultra-violet range with sophisticated devices such as phase shift masks, optical proximity or off-axis illumination. Exposure of the resist with charged particle beams is required to obtain smaller feature sizes which are becoming increasingly common in current integrated circuit designs. Electron beams are generally preferred for charged particle beam exposures since, among other relative advantages, the low mass of electrons allows control of the beam with relatively less power.

So-called probe-forming systems form a single well-focused spot at the target surface for exposure of the resist. This spot can be either scanned across selected portions of the surface or discrete spot exposures made in a step-and-repeat fashion. However, a single exposure is generally limited to a few hundred pixels, at most, while the full pattern required for a single integrated circuit chip may include hundreds of millions of pixels or more. Therefore, the throughput of probe-forming exposure tools is too low to be economically feasible for high density, large scale integrated circuits even though exposures can be made at relatively high speed.

To obtain acceptable levels of throughput, electron beam projection lithography has been recently developed. Projection lithography projects a pattern (which may contain several millions of pixels) from a subfield of a reticle which selectively intercepts or scatters portions of a relatively wide beam of charged particles. The pattern can be demagnified by the charged particle optics of the tool so that the pattern at the target is much smaller than the subfield pattern formed in the reticle. The subfield patterns formed in the reticle are stitched together in sequential exposures to form the overall circuit pattern of the complete integrated circuit design.

While the charged particle beam column of electron beam projection tools utilizes many elements which are more-or-less analogous to certain elements found in optical systems (and hence are often referred to as electron-optical elements or simply as lenses, stigmators and the like), many of the interrelationships among operational parameters of a charged particle beam system are often much more complex. For example, at a given beam current, aberrations are minimized and resolution is optimized only for a single value of numerical aperture (particle trajectory semi-angle) and vice-versa due to the contributions of stochastic Coulomb interactions, spherical aberration and chromatic aberration, each of which varies differently with changes in numerical aperture.

Thus, for any given numerical aperture, resolution varies with beam current as well as numerous other parameters of the particle beam column. For example, it is desirable to maintain the particle beam column as short as possible in order to limit the distance over which particles can interact, thus reducing the stochastic interactions among the electrons. However, reduction of beam current requires a corresponding increase in exposure time and small increases in individual subfield exposure time can have a major adverse impact on tool throughput in view of the number of subfield exposures that must be made for a single chip.

The variation of resolution with beam current presents a particularly intractable problem in charged particle beam projection systems which project a pattern established by a reticle subfield placed in the path of the charged particle (e.g. electron) beam. In practice, the defocus caused by the space-charge component of the electron interactions is corrected by refocusing the beam as the current is changed. However, the stochastic interactions are not correctable and vary as less than the first power of current.

To maximize throughput, it is expected that the placement of subfields in the reticle will match the pattern established on the integrated circuit by the designer. For integrated circuits containing memory (DRAM) cells, there is a substantially regular pattern of similar features and dimensions for many subfields. Therefore the transmission of the beam from respective subfields, and the resulting beam current of the patterned beam striking the wafer will be nearly identical. It is possible, on the other hand, that for other integrated circuits, the transmission from respective, and adjacent subfields, might differ substantially. To compensate for the space-charge defocusing, the beam is refocused on a subfield-by-subfield basis. Variations in the resolution between features of differing transmission is caused by the stochastic Coulomb interactions as discussed previously. This can affect the critical dimension (C/D) uniformity, which is usually specified as about 10% of the beam resolution.

Alteration of the beam current above the reticle to compensate for differing reticle subfield transmissivities, while possible (although changing the illumination optics cannot currently be accomplished with adequate speed), presents other problems and is not considered to be suitable. Thermal loading on critical elements (e.g., shaping, contrast and blanking apertures) would change with illumination current which might lead to a distortion of these elements causing alignment or illumination changes and/or astigmatism of the beam. These possible effects could require correction in order to maintain high image fidelity on the wafer. Furthermore, dynamically changing the beam current above the reticle causes the current density of the beam to change, which affects the electron dose (microCoulombs/cm$^2$) at the wafer. The exposure time would then have to change as a function of the beam current impinging on the reticle to keep the electron dose constant.

In general, operating parameters of charged particle beam systems may be approximately determined through simulation in order to consider the multiple interactions and variables of a complex charged particle beam column. However, final setting of operational parameters must be verified by testing of the actual performance of the charged particle beam tool. This process may be extremely expensive and time-consuming, particularly when hardware adjustments are required, such as alteration of numerical aperture.

Verification of the resolution of the beam over an entire integrated circuit pattern is especially difficult, primarily because many measurements of the C/D must be made. Furthermore, it is necessary to refocus the beam (to compensate for the space-charge component of the electron-electron interactions) depending on reticle subfield transmissivity. To assess the resolution as a function of current impinging on the wafer, one would have to deconvolve the measurements with the resist response. This might be of limited utility if there were a small range of subfield transmissivities on the reticle which would produce a limited range of beam currents.

Accordingly, there is a need for an arrangement for experimentally studying the resolution performance of charged-particle beam columns in response to changes of beam current. This is necessary to calibrate theoretical models, as well as optimize the numerical aperture. One unattractive solution would be to use one reticle subfield and alter the current impinging on the reticle, then refocus the beam and measure the resolution (either by a direct method or by writing a wafer), then change to beam current and so on. Unfortunately, when the beam current above the reticle is changed, there might be effects of charging, which might cause astigmatism, as mentioned above, and/or loss of resolution.

A more attractive alternative would be to keep the current impinging on the reticle constant and change the subfield transmissivity. However, prior to the present invention, it was only possible to change to a different subfield with a different discrete transmissivity and pattern which would therefore be limited to "sampling" of resolution at different beam currents and current density distributions. Such discrete smples may obscure important information, particularly in regard to complex system performance. Thus there is a need for an arrangement capable or producing continuously variable controllable beam current, by control of the transmissivity of a reticle subfield.

SUMMARY OF THE INVENTION

It is therefore an object of the present invention to provide an arrangement for facilitating evaluation of performance and verification of suitable operating parameters of a charged particle beam system.

It is another object of the invention to provide a variable transmissivity reticle for a charged particle beam projection system.

In order to accomplish these and other objects of the invention, a compound reticle for testing a charged particle beam projection system is provided including a first reticle layer having patterned areas, opaque areas and clear areas thereon, a second reticle layer having opaque areas and clear areas thereon, wherein the opaque areas and clear areas are substantially complementary to clear areas and opaque areas, respectively, on the first reticle layer, and a linear actuator for translating the reticle layers relative to each other in the manner of a shutter.

In accordance with another aspect of the invention, a method for controlling beam current in a charged particle beam projection lithography tool is provided including steps of illuminating a subfield of a compound reticle having two reticle layers with a beam of charged particles, a subfield of one of the reticle layers having opaque, clear and patterned areas thereon and a subfield of another of the reticle layers having clear areas complementary to opaque and patterned areas and opaque areas complementary to clear areas on the one reticle layer, and moving one of the reticle layers relative to another of the reticle layers.

BRIEF DESCRIPTION OF THE DRAWINGS

The foregoing and other objects, aspects and advantages will be better understood from the following detailed description of a preferred embodiment of the invention with reference to the drawings, in which:

FIG. 2A containing patterned areas (dark shading), clear areas (clear) and unpatterned membrane areas (hatched)and FIG. 2B containing clear areas (clear) and unpatterned membrane areas (hatched) and which will be referred to as a "shutter" reticle.

DETAILED DESCRIPTION OF A PREFERRED EMBODIMENT OF THE INVENTION

Figure 1:
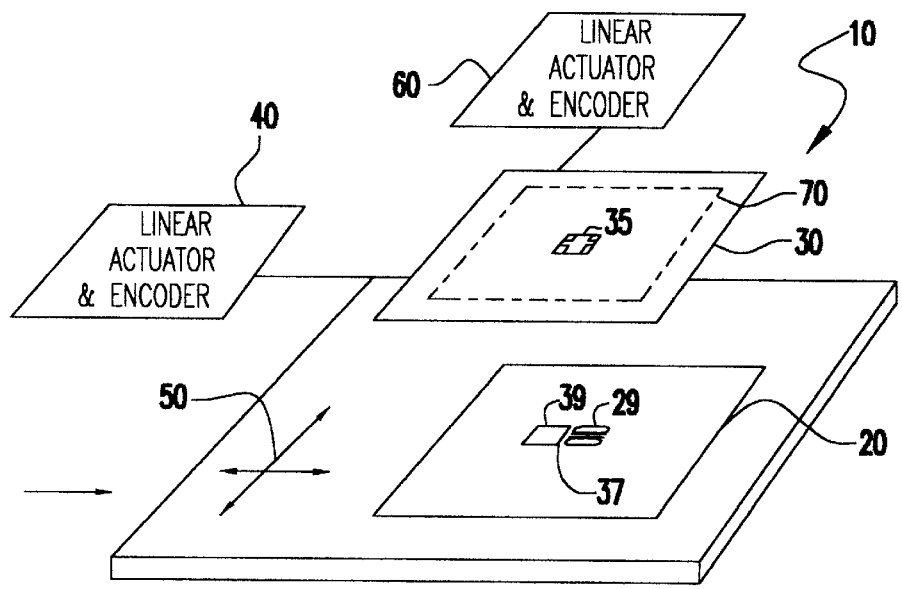
FIG. 1 is a perspective, exploded view of an adjustable compound reticle in accordance with the invention.

Referring now to the drawings, and more particularly to FIG. 1, there is shown an exploded view of an adjustable transmissivity compound reticle arrangement 10 in accordance with the invention. The compound reticle comprises at least two reticle layers 20, 30, which are preferably placed in close proximity with one layer overlaying the other. One of the reticle layers, preferably reticle layer 30, is movable relative to the other reticle layer by a linear actuator 40, such as a small piezoelectric motor. A position encoder can also be provided in combination therewith to improve positional accuracy and/or provide monitoring of the position of reticle layer 30. An additional linear actuator and position encoder 60 may also be provided for translation in orthogonal directions. Reticle layer 30 in combination with reticle layer 20 thus functions as a shutter as will be described below.

The order in which the layers are stacked is substantially immaterial to the practice of the invention but it is preferred for layer 20, which includes a subfield having patterned regions as will be discussed below, to be placed at the location in which a reticle corresponding to a design to be manufactured would ordinarily be placed (e.g. on translation table 50 which is not used during operation of the invention other than to properly position a subfield of the compound reticle in alignment with the beam). That is, the reticle layer which includes patterns to be imaged to the wafer should be located such that the resolution of the imaged pattern will accurately reflect performance of the tool in production and using a normal patterned reticle.

Figures 2A, 2B:
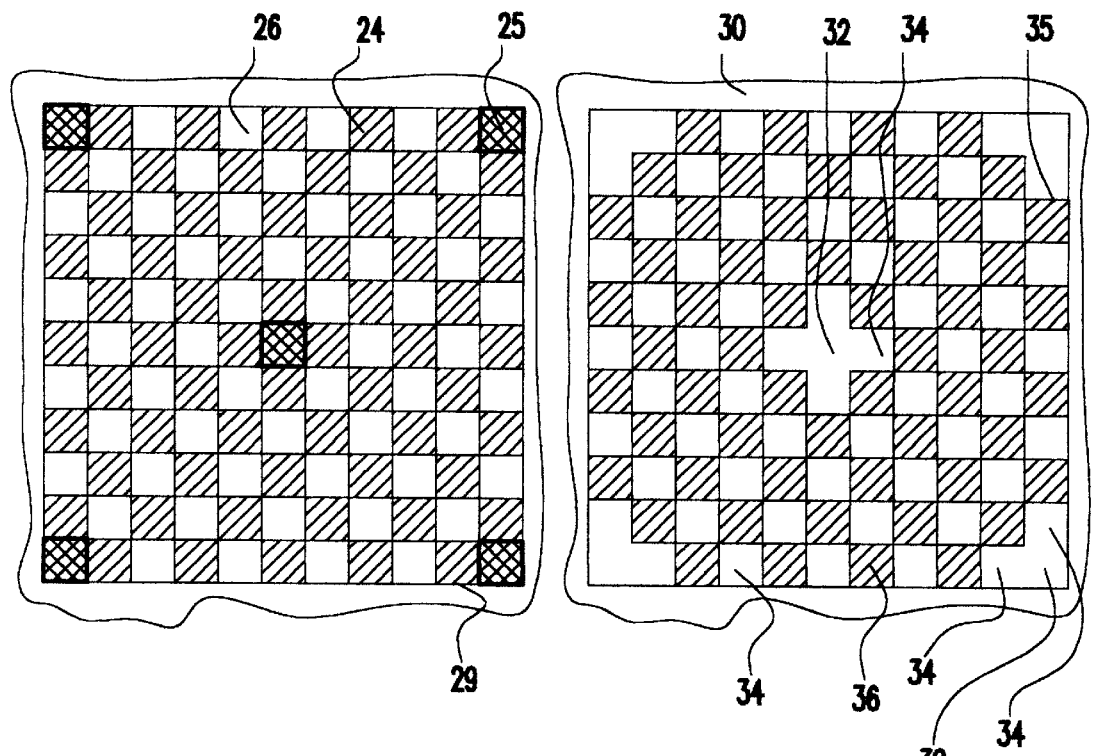
FIGS. 2A and 2B are plan views of preferred embodiments the invention.

It should be noted that the reticle layer 20 need only include a single subfield (e.g. 29 of FIG. 1) but may include multiple subfields on the reticle. Further, reticle layer 20, containing subfield 29, need only contain at least one patterned area 25, shown in FIG. 2A, in order to practice the invention. However, it is often desirable to have several patterned areas as shown in FIG. 2A (in the corners and center of the subfield). The patterned areas might include resolution features (e.g., isolated lines and/or nested line/space arrays of varying dimensions and pitch), calibration features or other features to assess resolution as a function of beam current striking the wafer. The charged-particle lithography tool will generally include a translation table at both reticle and wafer planes as well as deflection so that different reticle subfields can be exposed and projected onto desired locations on wafers at the target plane for tool performance evaluation.

Reticle 20 may contain subfield 29 as shown in FIG. 2A to aid in the determination of resolution as a function of beam current. The subfield 29 depicted in FIG. 2A contains three regions: the patterned areas 25 (dark shading) containing features approximating the design rules of an integrated circuit to be fabricated or the desired resolution to be obtained, open areas 26 where the image of the shaping aperture passes through unobstructed, and membrane (opaque) areas 24 (hatched) where the transmissivity is 0%. Only a relatively few patterned areas 25 are preferably provided and it is desirable that the patterned areas 25 be distributed over the subfield in a manner to observe the variations in image fidelity across the subfield. Thus, a preferred embodiment would include patterned areas at the corners and center of the subfield as shown in FIG. 2A. The patterned areas 25 will be projected to the target and later be evaluated to determine the actual beam resolution at various beam currents either by electronic means or by evaluating images in resist.

The remainder of the array of opaque areas 24 and open areas 26 in subfield 29 should be about equal in number and, preferably, symmetrically arranged. The actual pattern of the array of areas 24, 26 is not critical to the practice of the invention but a checkerboard pattern, as illustrated, (or, for example, a pattern of straight or undulating lines) is considered to be convenient, easily generated and fabricated and free from non-linearities of transmissivity function, as will be discussed below. The transmissivity of subfield pattern 29 is thus about 50% depending on the transmissivity of the features in areas 25. It is desirable that the transmissivity of subfield 29 closely approximate or slightly exceed 50% to provide the maximum range of beam current.

Reticle layer 30 may contain subfields similar to 35 as shown in FIG. 2B (the "shutter") which preferably includes only opaque areas 36 and open areas 34 arranged in a pattern which is complementary to the pattern of opaque and clear areas 24, 26 in reticle pattern 20. In this regard, however, open areas 32 are provided corresponding to locations of patterned areas 25 of subfield 29 of reticle layer 20. It is also desirable that open areas 34 be arranged adjacent to open areas 32 at least in one coordinate direction so that patterned areas 25 are not covered by opaque areas 36 during operation of the invention, as will be described below. In the pattern illustrated, this provision of open areas 32 results in L-shaped openings in the corners and a central cruciform shape in the subfield 35. The opaque areas 36 in reticle subfield 35 are located corresponding to open areas 26 in reticle subfield 29. The transmissivity of subfield 35 is thus somewhat greater than 50%. As a matter of design of the subfields 29, 35, once the desired locations of patterned areas 25 are determined, the open areas of subfield 35 are determined and the opaque areas of 24 of subfield 29 made complementary thereto.

Figure 3:
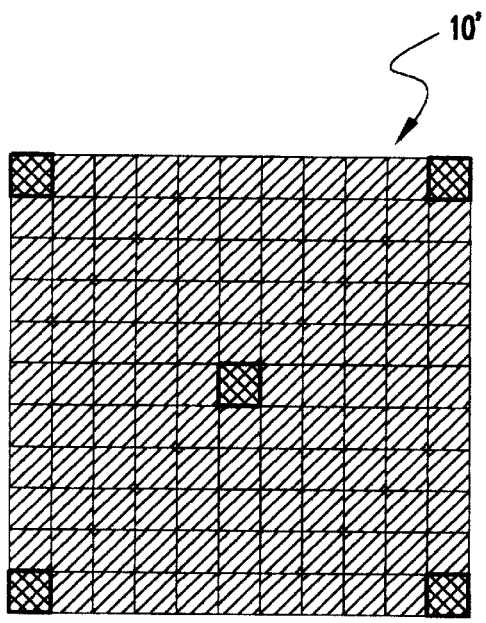
FIGS. 3, 4 and 5 illustrate operation of the invention to produce differing transmissivities and differing resulting beam currents.

Referring now to FIG. 3, if reticle layers 20 and 30 of compound reticle 10, a detail 10' of which is shown in FIG. 3, are aligned so the subfields 29 and 35 overlap such that clear areas 26 in subfield 29 are covered by opaque areas 36 in subfield 35, the transmissivity of compound subfield 10' and beam current exiting the subfield are reduced to substantially zero (e.g. the transmissivity of only the few, small patterned areas 25). However, as shown in FIG. 4, if reticle layer 30 is slightly shifted to the right (or to the left, as illustrated in FIG. 5) relative to reticle layer 20, the subfields 29, 35 will also be relatively shifted so that open areas 26, 34 partially coincide and beam current can be increased over a continuous range to a maximum corresponding to the lesser of the transmissivities of subfields 29 and 35.

The motion required for a full range of possible beam currents corresponds to the repetition period or size of areas (e.g. 24, 26, 34, 36) of the patterns or, as illustrated in FIGS. 2–5, is about 1/11 of the transverse dimension of the subfield pattern. Subfield dimensions for projection electron beam lithography tools at the reticle are 1 mm. Thus, the pitch of 1/11 of the subfield as illustrated in FIGS. 2–5 is about 90 micrometers at the reticle. A relative motion of 90 micrometers of subfield 29 with respect to subfield 35 changes the transmissivity from 50% to practically 0%, or about 0.5% transmissivity change per micrometer of relative motion.

Figure 4A:
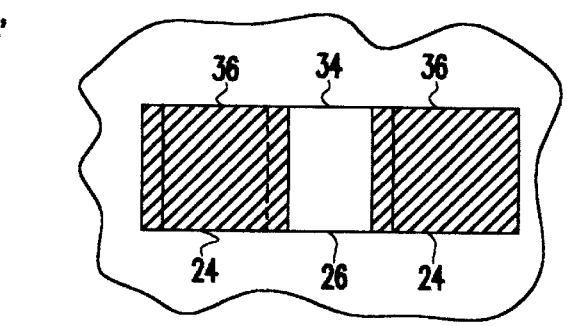
FIGS. 4A and 4B show a detail of FIG. 4 illustrating production of differing transmissivities in accordance with the invention.
Figure 4B:
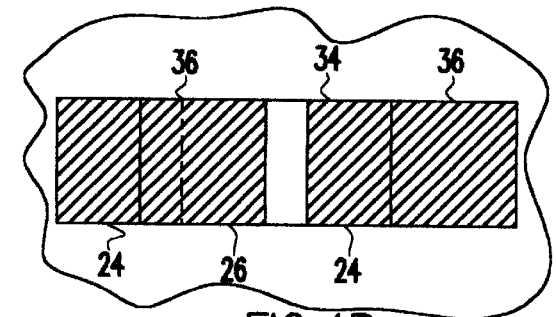
Figure 4:
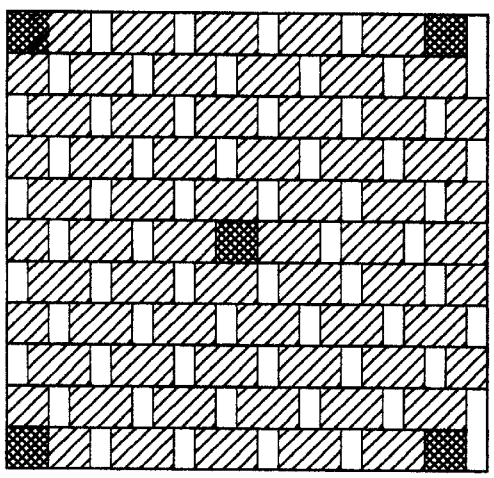
Figure 5:
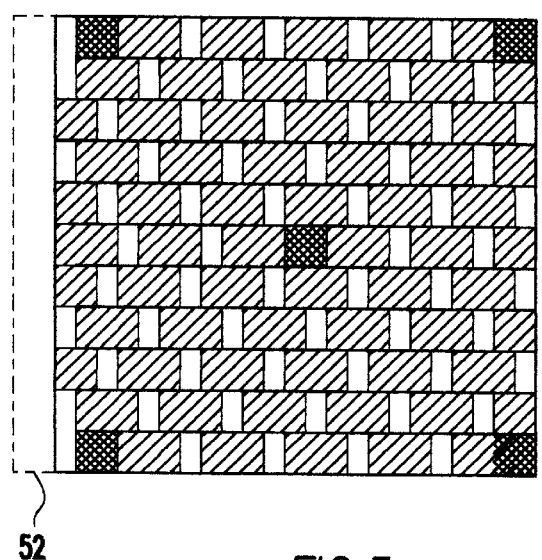

The relative motion can be continuous or incremental over arbitrarily small increments, depending on the linear actuator, to produce substantially any desired transmissivity between substantially zero and the lesser of the transmissivities of subfields 29 and 35, as shown in FIGS. 4 and 5 and, in greater detail, in FIGS. 4A and 4B showing transmissivities of about 40% and 10%, respectively. Accordingly, a small piezoelectric motor with encoder is suitable for practice of the invention with practical subfield sizes and opaque/clear area dimensions and an effectively symmetrical and homogeneous beam. The beam current striking the target after passing though the compound subfield, could be measured using a electrometer when the beam strikes a Faraday cup.

Alternatively, a greater range (e.g. greater than one repetition period) of relative movement and/or relative movement in two coordinate directions could be provided, as indicated by linear actuator 60 in FIG. 1. In this mode, the reticle layer/shutter 30 and subfield 35 could be used to adjust the transmission of subfield 39 adjacent to 29 on the reticle layer 20 which might contain different features than patterned area 25 of subfield 29. The linear actuator 40 would have to move reticle layer 30 more than the 1 mm subfield size so that subfield 35 could be used in conjunction with subfield 39 on reticle layer 20 to vary the transmission of subfield 39 rather than 29. Numerous effects including the introduction of asymmetries and/or inhomogeneities of current density in different regions of the beam cross-section can thus be produced without changing the compound reticle in the tool.

While the beam current densities developed as described above in regard to FIGS. 3–5, as discussed above are substantially homogeneous, a degree of inhomogeneity can be introduced by movement greater than a pattern period but less than a subfield dimension as shown at 52 of FIG. 5, so that a portion of the subfield of one reticle layer is covered by an opaque area (e.g. 37, possibly corresponding to reticle grillage) surrounding the subfield on the other reticle layer. In such a case, the actual motion and complementarity of the pattern may be slightly modified in the placement of open areas 32 to avoid covering patterned areas 25, as discussed above, such as by providing open stripes in or outside the subfield of reticle layer 30 to avoid or allow controlled covering of a portion of the patterned areas 25.

This variation of the invention including different or modified "complementary" subfield patterns on reticle layer 30 superimposed with one or more respective "patterned" subfields on reticle layers 20 can also include, for example, placing reticle layer 30 on a further translation table, schematically indicated by dashed line 70 in FIG. 1, to provide small positional adjustments or relatively larger position shifts in addition to linear actuators 40, 60, as described above. Further, if the positional resolution of translation table 70 is adequate, linear actuators 40 and/or 60 may not be required and translation table 70 substituted therefor.

The local Coulomb effect describes a condition where areas of features with locally high density and low density (within the same subfield) focus at differing planes, depending on the beam current. Furthermore, the shape of the subfield (distortion) depends on the variation in density of the reticle features and beam current. At low beam currents, the focus and subfield shape resemble those of an homogeneous subfield with the same transmissivity throughout. As an example, a subfield might contain an area with line/space patterns with a local density of about 50%, but another area within the same subfield might contain calibration or other sparse features with low local density.

Figure 6B:
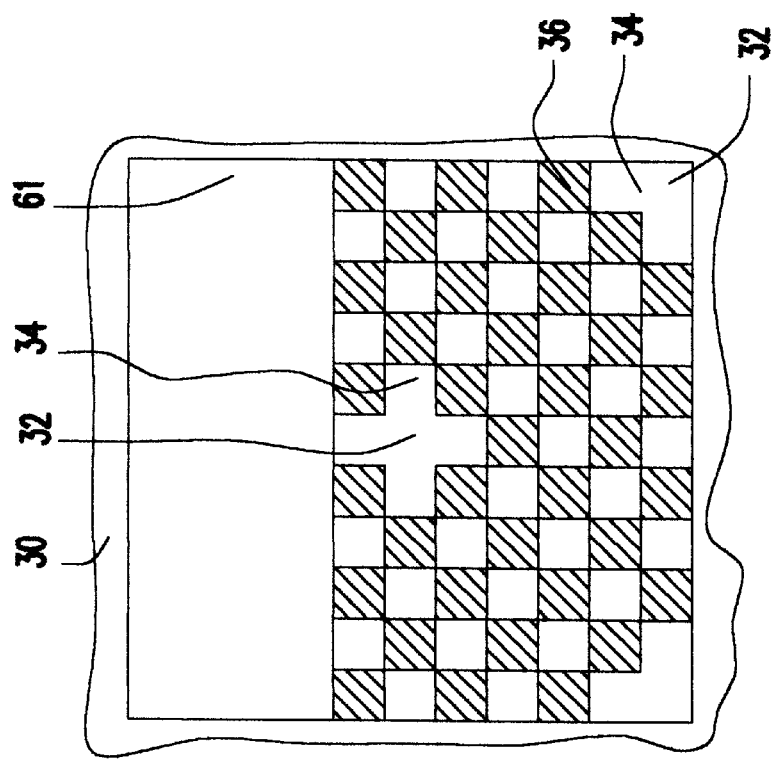
FIGS. 6A and 6B illustrate exemplary plan views of reticle layers for producing inhomogenoeous beam intensities in accordance with a variation or perfecting feature of the invention.
Figure 6A:
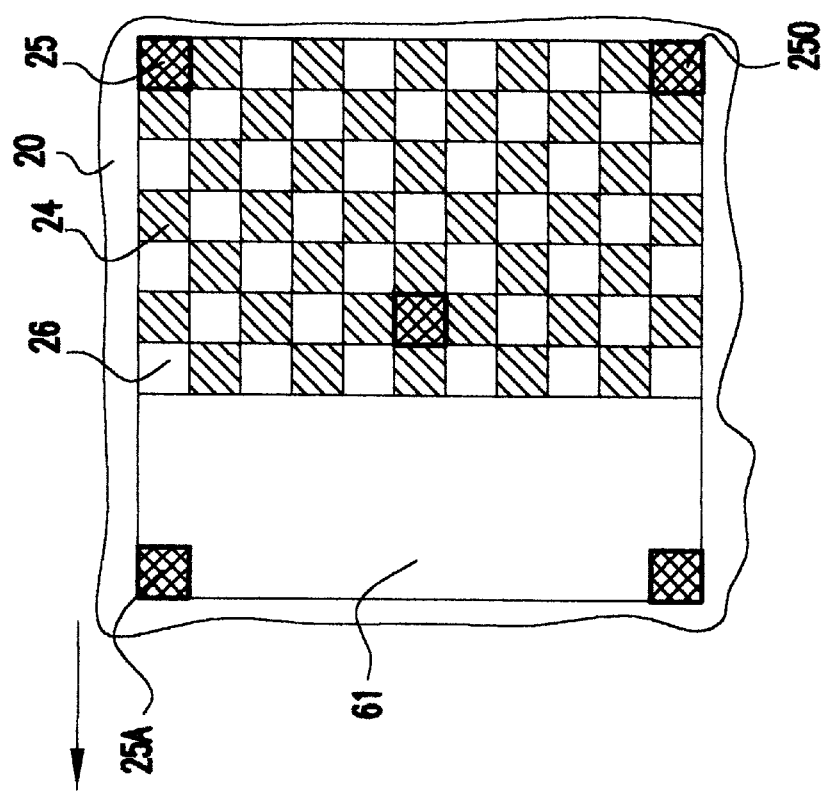

By measuring the transmitted beam current, as described above, the average density of the subfield can be determined. A generic, homogeneous, subfield 29 of patterned features 25 is illustrated in FIGS. 2–5 and has been described above. However, as a perfecting feature of the invention and to determine effects of local inhomogeneities that may be encountered in integrated circuit pattern subfields, the variable transmission reticle described above can easily be extended to inhomogeneous reticle subfields using a modified subfield on mask layer 20 and complementary subfield on reticle layer 30 having, for example, opaque areas 24, 36 or open areas 26, 34 omitted or added over a region 61 of the subfield of each of the respective layers as illustrated in FIGS. 6A and 6B.

When these two reticle subfields are superimposed in accordance with the invention (including adjustment of transmissity in unmodified areas), the patterned area 25a in the upper left of the subfield will be in an area of relatively high current density, whereas the patterned area 25b in the lower right of the subfield will be in an area of relatively low (and adjustable) current density. Such asymmetric patterns can be provided on the respective layers 20, 30 of compound reticle 10 together with subfields 29, 35 and moved to intercept the beam by the reticle stage translation table 50.

In view of the foregoing, it is seen that the invention provides an arrangement for facilitating study of the performance (especially resolution) of charged particle beam projection columns and tools at different beam currents that may be transmitted by variously patterned reticle subfields. By simulating differing transmissivities of reticle subfields using the invention, suitability of choice of operating parameters for imaging of respective subfields of a production reticle at adequate and satisfactory resolution can be rapidly determined empirically and simultaneously verified. The actual beam current can be measured and/or the compound reticle calibrated by measurement of current impinging on a Faraday cup placed below the compound reticle.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A compound reticle for testing a charged particle beam projection system including a first reticle layer having patterned areas, opaque areas and clear areas thereon, a second reticle layer having opaque areas and clear areas thereon, said opaque areas and clear areas being substantially complementary to clear areas and opaque areas, respectively, on said first reticle layer, and means for moving one of said first reticle layer and said second reticle layer relative to the other of said first reticle layer and said second reticle layer.

2. A compound reticle as recited in claim 1, wherein said means for moving one of said reticle layers relative to said other of said reticle layers includes a piezoelectric motor.

3. A compound reticle as recited in claim 2, wherein said means for moving one of said reticle layers relative to said other of said reticle layers further includes an encoder.

4. A compound reticle as recited in claim 1, wherein one of said first reticle layer and said second reticle layer is movable by a translation table.

5. A compound reticle as recited in claim 1, wherein said other reticle layer of said compound reticle includes a further, modified subfield, and wherein said means for moving includes means for superimposing said further, modified subfield on a subfield of said one reticle layer.

6. A compound reticle as recited in claim 1, wherein said compound reticle includes a further subfield including further subfields in said one and said other reticle layers.

7. A method for controlling beam current in a charged particle beam projection lithography tool including steps of illuminating a subfield of a compound reticle having two reticle layers with a beam of charged particles, a subfield of one of said two reticle layers having opaque, clear and patterned areas thereon and a subfield of another of said reticle layers having clear areas complementary to opaque and patterned areas and opaque areas complementary to clear areas on said one of said reticle layers, and moving one of said reticle layers relative to another of said reticle layers.

8. A method as recited in claim 7, including the further step of measuring at least one of resolution and aberrations in patterns projected from said patterned areas of said one of said reticle layers.

9. A method as recited in claim 7, wherein said step of moving one of said reticle layers includes movement along a single direction.

10. A method as recited in claim 7, wherein said step of moving one of said reticle layers includes movement along two orthogonal directions.

11. A method as recited in claim 7, wherein a pattern projected by said subfield of said compound reticle is substantially homogeneous.

12. A method as recited in claim 7, including the further step of moving said compound reticle to illuminate a further subfield of said compound reticle.

13. A method as recited in claim 12, wherein an image projected by said further subfield of said compound reticle is inhomogeneous.

14. A method as recited in claim 7, wherein said step of moving one of said reticle layers includes superimposing a further, modified subfield of said another reticle layer on said subfield of said one reticle layer.

15. A method as recited in claim 14, wherein an image projected by said further modified subfield of said compound reticle is inhomogeneous.

* * * * *